United States Patent [19]

Luft

[11] 4,154,869

[45] May 15, 1979

[54] ELECTROLESS PLATING METHOD WITH INSPECTION FOR AN UNBROKEN LAYER OF WATER PRIOR TO PLATING

[75] Inventor: Victor Luft, Minneapolis, Minn.

[73] Assignee: Honeywell Inc., Minneapolis, Minn.

[21] Appl. No.: 865,820

[22] Filed: Dec. 30, 1977

[51] Int. Cl.² .............................................. C23C 3/02
[52] U.S. Cl. ...................................... 427/8; 427/140; 427/142; 427/304; 427/305; 427/306; 427/430 A
[58] Field of Search .................. 427/304, 305, 306, 8, 427/430 A, 140, 142

[56] References Cited

U.S. PATENT DOCUMENTS

| | | | |
|---|---|---|---|
| 3,442,683 | 5/1969 | Lenoble et al. | 427/304 |
| 3,639,143 | 2/1972 | Lussow et al. | 427/305 |
| 3,798,050 | 3/1974 | Franz | 427/304 |
| 4,002,779 | 1/1977 | Nischwitz | 427/304 |
| 4,042,730 | 8/1977 | Cohen et al. | 427/305 |
| 4,066,809 | 1/1978 | Alpaugh et al. | 427/304 |
| 4,072,772 | 2/1978 | Franz | 427/304 |

FOREIGN PATENT DOCUMENTS 5149130 4/1976 Japan ....................................... 427/304

*Primary Examiner*—John D. Smith
*Attorney, Agent, or Firm*—John S. Munday

[57] ABSTRACT

Improvements are disclosed in the method of electroless deposition of a metal on a nonconductive surface wherein the surface is sequentially contacted with a tin salt solution, a palladium salt solution, and an electroless plating bath containing said metal. The improvement relates to preparing the surface to produce an unbroken layer of water adhering thereto upon dipping said surface in deionized water. The improvement further contemplates removing the surface from the electroless plating bath after formation of the visible amount of metal, inspecting the surface for imperfections, removing the metal, and recleaning the surface to remove imperfections. Finally, the activation steps are repeated followed by contacting the surface with an electroless plating bath to plate the desired quantity of metal thereon in a manner wherein uniformity and adhesion are improved.

5 Claims, No Drawings

ELECTROLESS PLATING METHOD WITH INSPECTION FOR AN UNBROKEN LAYER OF WATER PRIOR TO PLATING

BACKGROUND OF THE INVENTION

Electrically nonconductive materials may be coated with a metal by the utilization of inexpensive wet chemical techniques. The basic method employed comprises the use of a two-step sensitizing catalyzing procedure, using a tin salt and a palladium salt, followed by subsequent electroless plating of the desired metal on the nonconductive substrate. This basic idea of seeding a surface with palladium catalysts to initiate plating from an electroless plating solution is not new. This process is successfully used for printed wiring manufacture, decorative plating of plastic objects, and the like. U.S. Pat. No. 3,798,050 discloses a method of plating metal on substrates, and further discloses an improvement to that method. In that patent, effort is made to permit high speed assembly line manufacture of substrates, using a buffered solution to improve adherence of the metal to the substrate.

Certain characteristics have been observed when employing the chemical metallization techniques to various nonconductive substrate material. While the procedure works equally well on both polished and rough materials, adhesion to rough surfaces is generally better. Tests have been made using a tape test to determine adhesion to polished surfaces, however, and relatively good success has been achieved. In this tape test, application of a pressure sensitive tape to a metallized film, followed by rapid stripping of the tape, shows little, if any, metal adhering to the tape. Metal films formed by this plating process are extremely uniform and repeatable, thereby permitting manufacture of interchangeable quantities of relatively sophisticated designs.

An extremely small quantity of palladium metal is involved in the process, and, therefore, the expense is not substantial due to the use of this raw material. The palladium solution is extremely stable and may be used for an extensive period of time. The sensitized catalyzed surface prior to plating remains active for several days and is completely transparent and electrically nonconductive. The plated metal surface replicates the texture of the substrate. A polished glass substrate, for example, produces a mirror polished metal film.

While chemical metallization has found a variety of uses, one of the problems associated with the process is the difficulty to completely and totally cover the surface without defects or imperfections on the surface. It is known that metal will plate wherever the catalyst is present, although the mechanism for the plating is not precisely understood. While it may appear simple to ensure complete plating by merely ensuring complete coating with the sensitizing and catalyzing agents, the presence or absence of the sensitizing agents is difficult to ascertain. Particularly, this is true because the sensitizing catalyzing surface is completely transparent to visible light and is electrically nonconductive to thousands of megohms. Oftentimes, surfaces which are too hydrophobic will not wet adequately to permit formation of the sensitizing catalyzing agents on the surface. Impurities and contaminants will either mask or poison the sensitizing and catalyzing agents and will prevent a complete metallization free from defects and imperfections.

Accordingly, it is an object of this invention to provide a method for electrolessly plating metals on surfaces substantially free from defects or imperfections.

Another object of this invention is to provide a method for inspecting the sensitizing and catalyzing step in the electroless plating method to ensure complete catalyzation and therefore complete metallization of the surface being treated.

Yet another object of this invention is to improve the uniformity and adherence of the metal to the substrate.

BRIEF DESCRIPTION OF THE INVENTION

It has now been discovered that the method of electroless plating on a nonconductive substrate or surface, wherein the substrate is sequentially contacted with a tin salt solution, a palladium salt solution, and an electroless plating bath containing said metal can be improved in the following manner. Specifically, the improvement comprises preparing the nonconductive surface to form an unbroken layer of water adhering thereto upon dipping said surface in deionized water. This is done by cleaning the surface, followed by contacting the surface with a tin salt and then by contacting the sensitized surface with a palladium salt to catalyze the surface. It may be necessary to repeat these three steps to obtain the unbroken layer of water which indicates proper preparation of the surface. The next step includes electrolessly plating the surface with a metal for sufficient time to plate a visible amount of metal thereon, inspecting the surface for plating imperfections, removing the plating, and recleaning the areas of imperfections, followed by recleaning, resensitizing, recatalyzing, and, finally, electrolessly plating the surface with the desired amount of metal.

In one embodiment of the present invention, the deionized water has a resistivity of at least one megohm centimeter. It is preferred that the tin salt be comprised of a stannous chloride solution in deionized water. Similarly, the preferred palladium salt is palladium chloride dissolved in deionized water.

DETAILED DESCRIPTION OF THE INVENTION

As has been stated above, it is possible to electrolessly plate metal on nonconductive substrates by first contacting the substrate with a tin solution followed by a palladium solution followed by an electroless plating bath.

It is preferred that stannous chloride be used as the tin salt solution. A typical solution containing a tin salt would include from 0.0037 grams to 0.018 grams of stannous chloride, from 0.0025 to 0.012 milliliters of 37 percent hydrochloric acid and deaerated deionized water added to give a total volume of one liter. As used herein, deaerated water means water which has had a significant amount of the dissolved air removed by various methods, such as boiling and ultrasonic agitation. Deionized water means water which has a resistivity of at least one megohm centimeter.

A preferred tin salt solution would be 0.0147 grams of stannous chloride, 0.010 milliliters of 37 percent hydrochloric acid, and sufficient deaerated deionized water to make up one liter of solution.

While a wide variety of palladium salt may be employed as the palladium salt solution, it is preferred for the purposes of this invention to have used palladium chloride. Plating solutions using palladium chloride may be prepared by adding from 0.05 grams to 6.0 grams of palladium chloride to 37 percent by weight hydrochloric acid ranging from 0.07 milliliters to 8.4 milliliters, and sufficient deaerated deionized water to make up one liter. A preferred palladium salt solution comprises 5.0 grams of palladium chloride, 7.0 milliliters of 37 percent hydrochloric acid and sufficient deaerated deionized water to make up one liter of solution.

While the method of the present invention is applicable to most substrates which are nonconductive and to most metals which are capable of being plated, specific modifications will become apparent to those skilled in the art for application of this invention to specific substrates and/or metals being used. In order to form a continuous, uniform, adherent metal film, it is necessary that the substrate be cleaned and prepared so that an unbroken layer of water will adhere to the substrate when immersed and withdrawn from deionized water. The cleaning step may be accomplished by physical means, such as ultrasonic vibration cleaning or by chemical means. Examples of cleaning solutions are potassium carbonate solutions, sodium hydroxide solutions, and the various chromic/sulfuric acid solutions which are conventionally employed as cleaning agents. The most important consideration is to use a cleaning method which will not undesirably etch or otherwise alter the surface of the substrate. Once the substrate has been cleaned, it should be rinsed thoroughly with deionized water.

Following cleaning of the substrate, the substrate is immersed and agitated in a tin salt solution such as that described hereinabove. Normally, it is necessary to immerse the substrate in the tin salt solution for at least fifteen seconds so as to ensure complete contact of the substrate with the tin ions. Following the contact with the tin salt solution, the substrate is then immersed in a palladium salt solution and allowed to remain for at least fifteen seconds or more with no agitation. It is preferred that no rinsing of the substrate be done between the immersion in the tin salt solution and the immersion in the palladium salt solution.

At this point, once the palladium salt solution has been contacted on the substrate, the substrate is rinsed again in deionized water, and the sensitizing/catalyzing sequence is repeated one or more times, until an unbroken layer of water is formed. Once this step (or steps) is complete, the substrate is placed in an electroless plating solution and is initiated by a catalyst. One useful example of a plating solution is Cuposit NL-63, manufactured by the Shipley Company, which is a nickel/phosphorous plating solution. Normally, the metallization need take place for only a short period of time until a visible amount of metal has been formed. Typically, 15 to 30 seconds of electroless plating at 180° F. will produce a visible amount of metal on the nonconductive surface.

After the light amount of metal has been plated on the surface, it should be inspected to determine if complete metal coverage has been achieved. Any residual contaminants, such as adhesive, used to bond the material for one reason or another, or other impurities which tend to mask and/or poison the sensitizing or catalyzing agents will be revealed by the thin layer of metal since metallization only occurs on the surface where it has been both sensitized and catalyzed. The second advantage to precatalyzing the surface with the minor amount of metal deposited thereon is to increase the wetability of the surface since many materials sought to be metallized are relatively hydrophobic. Surfaces which have been lightly metallized, cleaned, and remetallized appear to be more easily wetted by the sensitizing solution and catalyst solution, although the reason for this is not precisely understood. Metal films formed adhere more strongly and uniformly.

Once the inspection of the visible thin metal has been completed, and areas of imperfection have been noted, the thin layer of metal may be dissolved or otherwise removed, such as, for example, by immersion in a nitric acid solution diluted with equal parts of deionized water. Normally, approximately one minute of time is necessary to remove the plated metal.

At this point, the sensitizing through the use of a tin salt solution and the catalyzing through the use of a palladium salt solution are repeated, followed by contacting the surface with an electroless plating bath for sufficient time to plate the desired quantity of metal thereon. After plating, the finished product may be rinsed in deionized water and blown dry with dry nitrogen or other oxygen-free gases. In a preferred embodiment, it is desirable to heat the metallized surface at a temperature above the boiling point of water for a short period of time.

The process of this invention is useful on a variety of nonconductive surfaces, such as glass, quartz, and other nonporous materials, as well as on plastic or porous materials such as epoxies and other thermosetting resins, thermoplastics, fiberglass cloth, paper, cotton cloth, and synthetic cloth. Experiments have been performed on a wide variety of materials, including untreated teflon, and all metallizations have been successful. In one particular set of experiments, a number of electro-optically active lenses were prepared from a ceramic conventionally known as PLZT. Efforts were made to electrolessly plate electrodes onto these lenses. Using the prior art methods of sensitizing, catalyzing, and plating, only 50 percent of the lenses plated had defect-free electrodes. Essentially, 100 percent of those lenses made according to the present lenses were defect-free. Thus, it is seen that the process of this invention substantially improved the metallization by providing a defect-free manufacturing process. Increased uniformity and strength of adherence were obtained using the present invention.

Having thus described the invention, what is claimed is:

1. A method of plating metal on nonconductive surfaces, comprising the steps of:
   a. Cleaning a nonconductive surface to remove impurities;
   b. Contacting said cleaned surface with a tin salt to sensitize said surface, followed by contacting said sensitized surface with a palladium salt to catalyze said surface;
   c. Rinsing said surface in deionized water to inspect for an unbroken layer of water adhering to said surface, and repeating step b. above until said unbroken layer of water is found; and
   d. Electrolessly plating said surface with a desired amount of metal.

2. The method of claim 1, which further includes the steps of:
   a. Cleaning a nonconductive surface to remove impurities;
   b. Contacting said cleaned surface with a tin salt to sensitize said surface, followed by contacting said sensitized surface with a palladium salt to catalyze said surface;

c. Rinsing said surface in deionized water to inspect for an unbroken layer of water adhering to said surface, and repeating step b. above until said unbroken layer of water is found;

d. Electrolessly plating said surface with said metal for sufficient time to plate a visible amount of metal thereon;

e. Inspecting said surface for plating imperfections, removing said plating, and recleaning said areas of imperfections;

f. Repeating said steps in b. and c. above; and g. Electrolessly plating said surface with a desired amount of metal.

3. The method of claim 1, wherein said deionized water has a resistivity of at least one megohm centimeter.

4. The method of claim 1, wherein said tin salt is stannous chloride.

5. The method of claim 1, wherein said palladium salt is palladium chloride.

* * * * *